(12) United States Patent
Kwon

(10) Patent No.: US 10,748,639 B2
(45) Date of Patent: Aug. 18, 2020

(54) CONTROLLER, OPERATING METHOD THEREOF AND MEMORY SYSTEM INCLUDING THE CONTROLLER

(71) Applicant: SK hynix Inc., Gyeonggi-do (KR)

(72) Inventor: Yang-Hyeon Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 81 days.

(21) Appl. No.: 16/196,374

(22) Filed: Nov. 20, 2018

(65) Prior Publication Data

US 2019/0311775 A1 Oct. 10, 2019

(30) Foreign Application Priority Data

Apr. 6, 2018 (KR) .................. 10-2018-0040493

(51) Int. Cl.
*G11C 29/38* (2006.01)
*G11C 29/12* (2006.01)
*G11C 16/34* (2006.01)

(52) U.S. Cl.
CPC .......... *G11C 29/38* (2013.01); *G11C 16/3436* (2013.01); *G11C 16/3472* (2013.01); *G11C 29/12005* (2013.01)

(58) Field of Classification Search
CPC ..... G11C 29/38; G11C 29/12; G11C 16/3436; G11C 16/3472
USPC ....... 714/719, 718, 763; 365/185.22, 185.29, 365/185.3, 200, 201, 236
See application file for complete search history.

(56) References Cited

U.S. PATENT DOCUMENTS

| | | | | |
|---|---|---|---|---|
| 5,675,540 A | * | 10/1997 | Roohparvar | G11C 29/50 365/185.22 |
| 5,751,944 A | * | 5/1998 | Roohparvar | G11C 29/52 365/201 |
| 7,839,690 B2 | * | 11/2010 | Lee | G11C 11/5635 365/185.18 |
| 8,169,832 B2 | * | 5/2012 | Sarin | G11C 16/3445 365/185.18 |
| 2010/0149881 A1 | * | 6/2010 | Lee | G11C 11/5635 365/185.33 |
| 2012/0026792 A1 | * | 2/2012 | Moschiano | G11C 11/5635 365/185.03 |
| 2017/0116070 A1 | * | 4/2017 | Alrod | G11C 16/26 |
| 2018/0350443 A1 | * | 12/2018 | Chan | G11C 11/5628 |
| 2020/0004453 A1 | * | 1/2020 | Rori | G06F 3/0679 |

FOREIGN PATENT DOCUMENTS

KR 1020170069756 6/2017

* cited by examiner

*Primary Examiner* — John T Tabone, Jr.
(74) *Attorney, Agent, or Firm* — IP & T Group LLP

(57) ABSTRACT

A controller includes a processor suitable for performing a first erase operation on a target memory block; a tester suitable for performing a test operation to apply test voltages to selected points of word lines included in the target memory block; a counter suitable for counting the numbers of error memory cells sensed through the test voltages at the selected points; and a skipper suitable for setting test skip information based on the numbers of error memory cells.

20 Claims, 12 Drawing Sheets

CONTROLLER, OPERATING METHOD THEREOF AND MEMORY SYSTEM INCLUDING THE CONTROLLER

CROSS-REFERENCE TO RELATED APPLICATIONS

The present application claims priority under 35 U.S.C. § 119(a) to Korean Patent Application No. 10-2018-0040493 filed on Apr. 6, 2018, the disclosure of which is incorporated herein by reference in its entirety.

BACKGROUND

1. Field

Various exemplary embodiments of the present invention relate to a controller and a memory system. Particularly, exemplary embodiments relate to a controller capable of efficiently managing data, and an operating method thereof and a memory system including the controller.

2. Description of the Related Art

The computer environment paradigm has moved towards ubiquitous computing, which enables computing systems to be used anytime and anywhere. As a result, the demand for portable electronic devices, such as mobile phones, digital cameras, and laptop computers have increased rapidly. Those electronic devices generally include a memory system using a memory device as a data storage device. The data storage device may be used as a main memory unit or an auxiliary memory unit of a portable electronic device.

Since there is no mechanical driving part, a data storage device using a memory device provides advantages such as excellent stability and durability, fast information access speed, and low power consumption. Also, the data storage device can have a quick data access rate with low power consumption than the hard disk device. Non-limiting examples of the data storage device having such advantages include universal serial bus (USB) memory devices, memory cards of diverse interfaces, solid-state drives (SSD) and the like.

SUMMARY

Various embodiments of the present invention are directed to a controller and a memory system capable of performing efficiently an erase operation.

In accordance with an embodiment of the present invention, a controller may include: a processor suitable for performing a first erase operation on a target memory block; a tester suitable for performing a test operation to apply test voltages to selected points of word lines included in the target memory block; a counter suitable for counting the numbers of error memory cells sensed through the test voltages at the selected points; and a skipper suitable for setting test skip information based on the numbers of error memory cells, wherein the tester performs the test operation according to the test skip information when a second erase operation is performed on the target memory block, wherein the first erase operation comprises an erase operation performed before the test skip information is set, and the second erase operation comprises an erase operation performed after the test skip information is set.

In accordance with an embodiment of the present invention, an operating method of controller may include: performing a first erase operation on a target memory block; performing a test operation to apply test voltages to selected points of word lines included in the target memory block; counting the numbers of error memory cells sensed through the test voltages at the selected points; and setting test skip information based on the numbers of error memory cells; and performing the test operation according to the test skip information when a second erase operation is performed on the target memory block, wherein the first erase operation comprises an erase operation performed before the test skip information is set, and the second erase operation comprises an erase operation performed after the test skip information is set.

In accordance with an embodiment of the present invention, a memory system may include a memory device comprising a target memory block; and a controller suitable for controlling the memory device, wherein the controller may include: a processor suitable for performing a first erase operation on the target memory block; a tester suitable for performing a test operation to apply test voltages to selected points of word lines included in the target memory block; a counter suitable for counting the numbers of error memory cells sensed through the test voltages at the selected points; and a skipper suitable for setting test skip information based on the numbers of error memory cells, wherein the tester performs the test operation according to the test skip information when a second erase operation is performed on the target memory block, wherein the first erase operation comprises an erase operation performed before the test skip information is set, and the second erase operation comprises an erase operation performed after the test skip information is set.

In accordance with an embodiment of the present invention, a memory system may include a memory device including a target memory block having at least one word line; and a controller suitable for controlling the memory device to perform erase operations on the target memory block, wherein the controller: performs a first erase operation on the target memory block; performs a first test operation to determine a status of the target memory block as a result of the first erase operation by applying at least one test voltage to the word line of the target memory block; determining the number of error memory cells based on the first test operation; performs a second erase operation on the target memory block; selectively performs a second test operation to determine the status of the target memory block as a result of the second erase operation by applying the test voltage to the word line of the target memory block, based on the number of error memory cells, wherein the controller skips the second test operation when the number of error memory cells is less than a threshold value.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
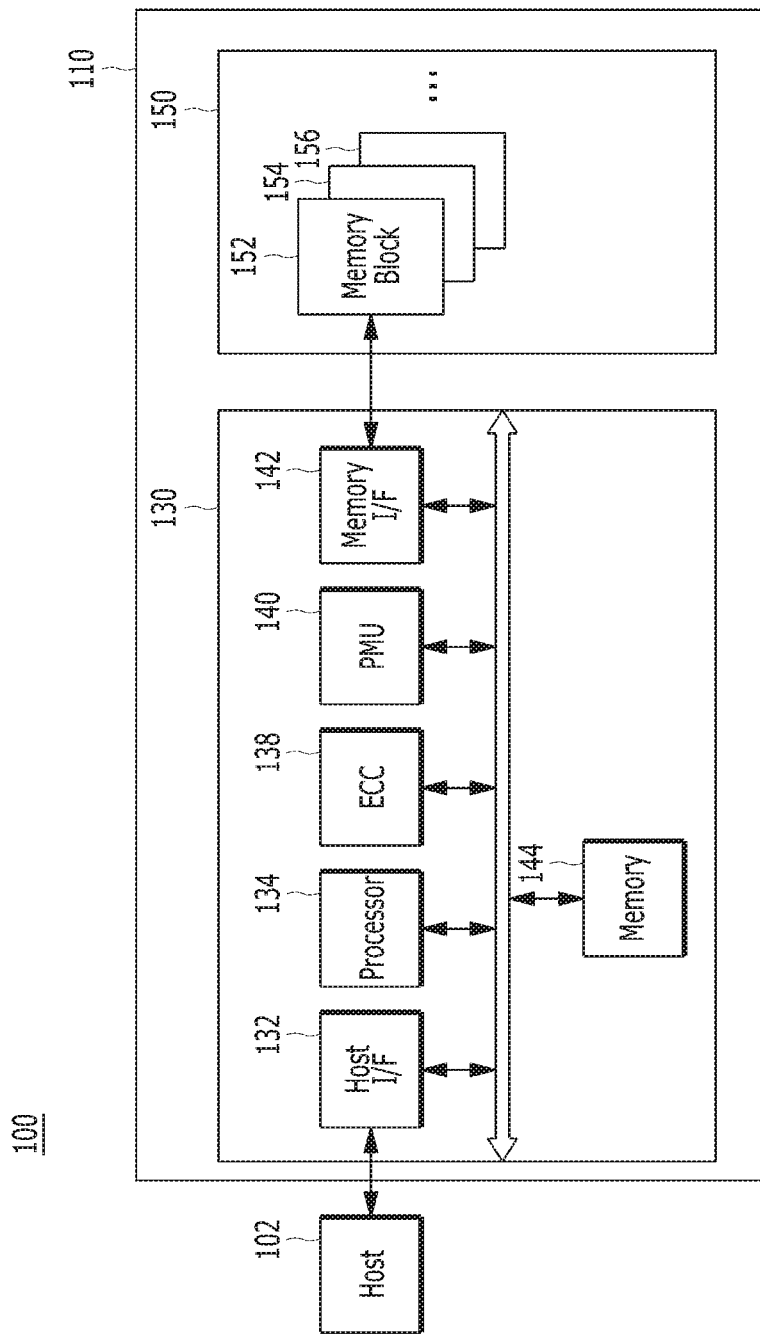
FIG. 1 is a block diagram illustrating a data processing system including a memory system in accordance with an embodiment of the present disclosure.

Various examples of the disclosure are described below in more detail with reference to the accompanying drawings. The disclosure may be embodied in different other embodiments, forms and variations thereof and should not be construed as being limited to the embodiments set forth herein. Rather, the described embodiments are provided so that this disclosure will be thorough and complete, and will fully convey the disclosure to those skilled in the art to which this invention pertains. Throughout the disclosure, like reference numerals refer to like parts throughout the various figures and examples of the disclosure. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player and a laptop computer or an electronic device such as a desktop computer, a game player, a television (TV), a projector and the like.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such, for example, as a dynamic random access memory (DRAM) and a static RAM (SRAM) and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102, and the controller 130 may control storage of data in the memory device 150.

The controller 130 and the memory device 150 may be integrated into a single semiconductor device, which may be included in the various types of memory systems as exemplified above.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while an electrical power is not supplied. The memory device 150 may store data provided from the host 102 through a write operation, and provide data stored therein to the host 102 through a read operation. The memory device 150 may include a plurality of memory blocks 152 to 156, each of the memory blocks 152 to 156 may include a plurality of pages. Each of the plurality of pages may include a plurality of memory cells to which a plurality of word lines (WL) are electrically coupled.

The controller 130 may control overall operations of the memory device 150, such as read, write, program and erase operations. For example, the controller 130 may control the memory device 150 in response to a request from the host 102. The controller 130 may provide the data, read from the memory device 150, with the host 102, and/or may store the data, provided by the host 102, into the memory device 150.

The controller 130 may include a host interface (I/F) 132, a processor 134, an error correction code (ECC) unit 138, a power management unit (PMU) 140, a memory interface (I/F) 142, and a memory 144 all operatively coupled via an internal bus.

The host interface 132 may process commands and data provided from the host 102, and may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE).

The ECC unit 138 may detect and correct errors in the data read from the memory device 150 during the read operation. When the number of the error bits is greater than or equal to a threshold number of correctable error bits, the ECC unit 138 may not correct error bits but may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all or some of circuits, modules, systems or devices for performing the error correction operation based on at least one of the above described codes.

The PMU 140 may provide and manage power of the controller 130.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134, in a case when the memory device 150 is a flash memory and, in particular, when the memory device 150 is a NAND flash memory.

The memory 144 may serve as a working memory of the memory system 110 and the controller 130, and may store temporary or transactional data for operating or driving the memory system 110 and the controller 130. The controller 130 may control the memory device 150 in response to a request from the host 102. The controller 130 may deliver data read from the memory device 150 into the host 102, may store data entered through the host 102 within the memory device 150. The memory 144 may be used to store data required for the controller 130 and the memory device 150 in order to perform these operations.

The memory 144 may be implemented with a volatile memory. The memory 144 may be implemented with a static random access memory (SRAM) or a dynamic random access memory (DRAM). Although FIG. 1 exemplifies the memory 144 disposed within the controller 130, the disclosure is not limited thereto. That is, the memory 144 may be located inside or outside the controller 130. For instance, the memory 144 may be embodied by an external volatile memory having a memory interface transferring data and/or signals transferred between the memory 144 and the controller 130.

The processor 134 may control the overall operations of the memory system 110. The processor 134 may drive or execute a firmware to control the overall operations of the memory system 110. The firmware may be referred to as a flash translation layer (FTL).

An FTL may perform an operation as an interface between the host 102 and the memory device 150. The host 102 may transmit requests for write and read operations to the memory device 150 through the FTL.

The FTL may manage operations of address mapping, garbage collection, wear-leveling and so forth. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, through the address mapping operation based on the map data, when the controller 130 updates data of a particular page, the controller 130 may program new data on another empty page and may invalidate old data of the particular page due to a characteristic of a flash memory device. Further, the controller 130 may store map data of the new data into the FTL.

The processor 134 may be implemented with a microprocessor or a central processing unit (CPU). The memory system 110 may include one or more processors 134.

A management unit (not shown) may be included in the processor 134. The management unit may perform bad block management of the memory device 150. The management unit may find bad memory blocks included in the memory device 150, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 100, and thus reliable bad block management is required.

Figure 2:
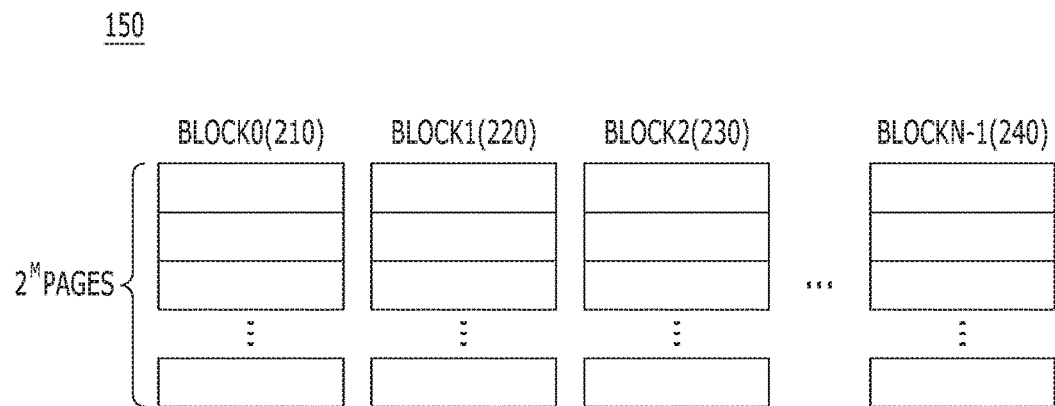
FIG. 2 is a schematic diagram illustrating an exemplary configuration of a memory device of the memory system shown in FIG. 1.

FIG. 2 is a schematic diagram illustrating the memory device 150.

Referring to FIG. 2, the memory device 150 may include the plurality of memory blocks BLOCK0 to BLOCKN−1, and each of the blocks BLOCK0 to BLOCKN−1 may include a plurality of pages, for example, $2^M$ pages, the number of which may vary according to circuit design. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Figure 3:
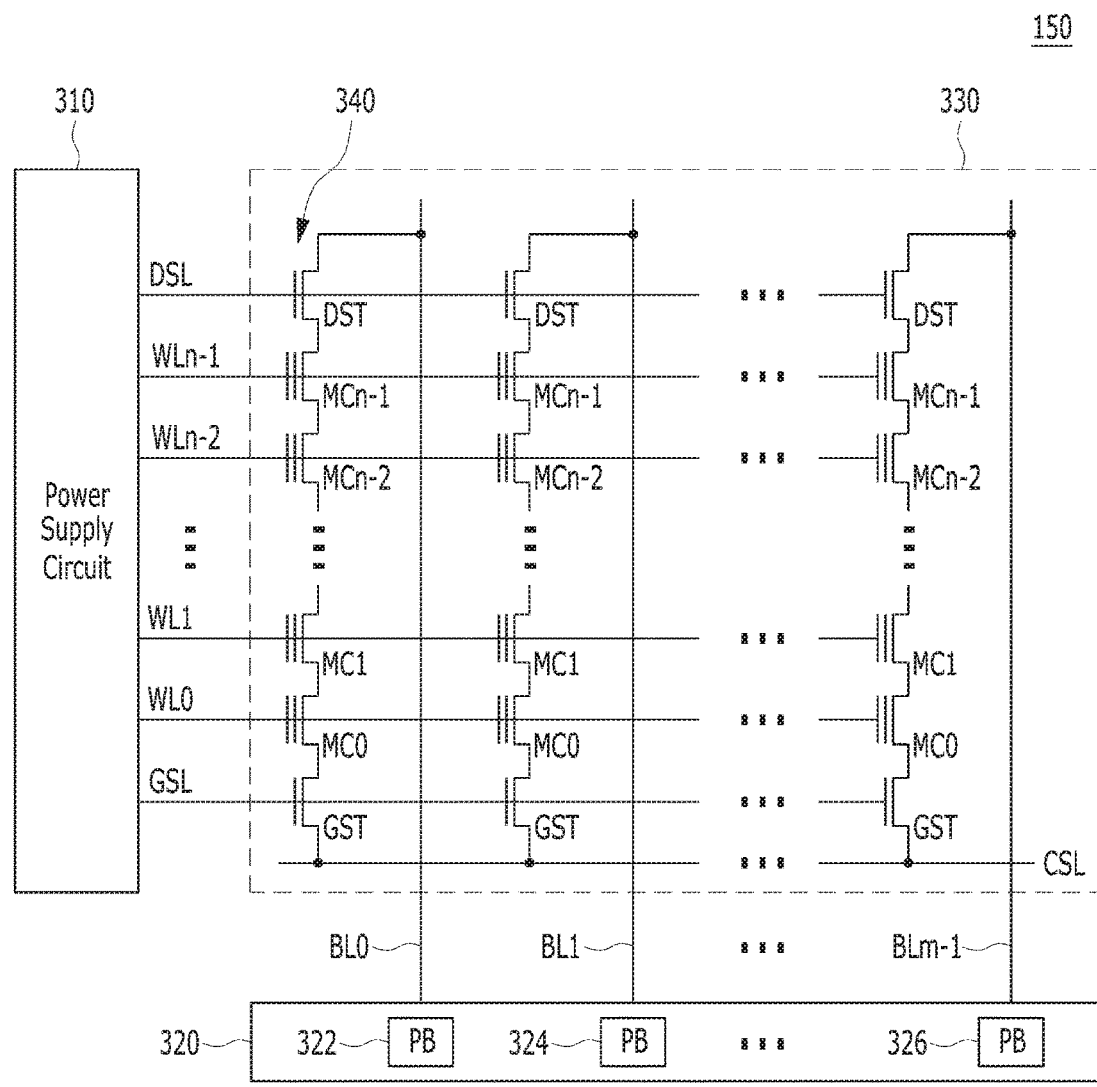
FIG. 3 is a circuit diagram illustrating an exemplary configuration of a memory cell array of a memory block in the memory device shown in FIG. 2.

FIG. 3 is a circuit diagram illustrating a memory block 330 in the memory device 150.

Referring to FIG. 3, the memory block 330 may correspond to any of the plurality of memory blocks 152 to 156 included in the memory device 150 of the memory system 110.

The memory block 330 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by single level cells (SLC) each of which may store 1 bit of information, or by multi-level cells (MLC) each of which may store data information of a plurality of bits. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 only shows, as an example, that the memory block 330 is constituted with NAND flash memory cells, it is to be noted that the memory block 330 of the memory device 150 according to the embodiment is not limited to a NAND flash memory. The memory block 330 may be realized by a NOR flash memory, a hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply circuit 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The power supply circuit 310 may perform a voltage generating operation under the control of a control circuit (not shown). The power supply circuit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read and write (read/write) circuit 320 of the memory device 150 may be controlled by the control circuit, and may serve as a sense amplifier or a write driver according to an operation mode. During a verification operation or a normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
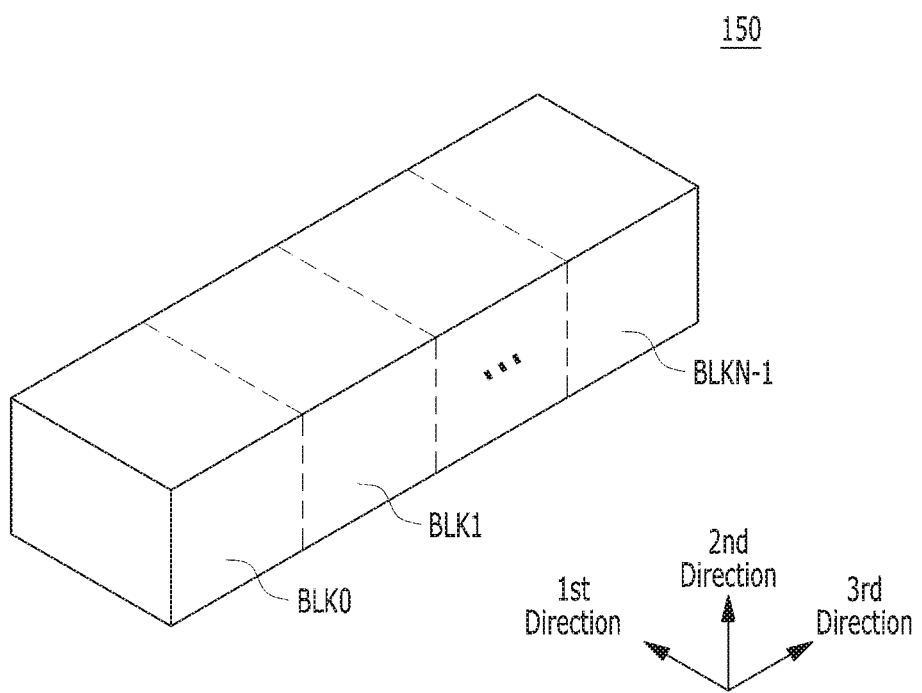
FIG. 4 is a schematic diagram illustrating an exemplary three-dimensional structure of the memory device shown in FIG. 2.

FIG. 4 is a schematic diagram illustrating a 3D structure of the memory device 150.

Although FIG. 4 shows a 3D structure, the memory device 150 may be embodied by a two-dimensional (2D) or three-dimensional (3D) memory device. Specifically, as illustrated in FIG. 4, the memory device 150 may be embodied in a nonvolatile memory device having a 3D stack structure. When the memory device 150 has a 3D structure, the memory device 150 may include a plurality of memory blocks BLK0 to BLKN−1 each having a 3D structure (or a vertical structure).

Figure 5:
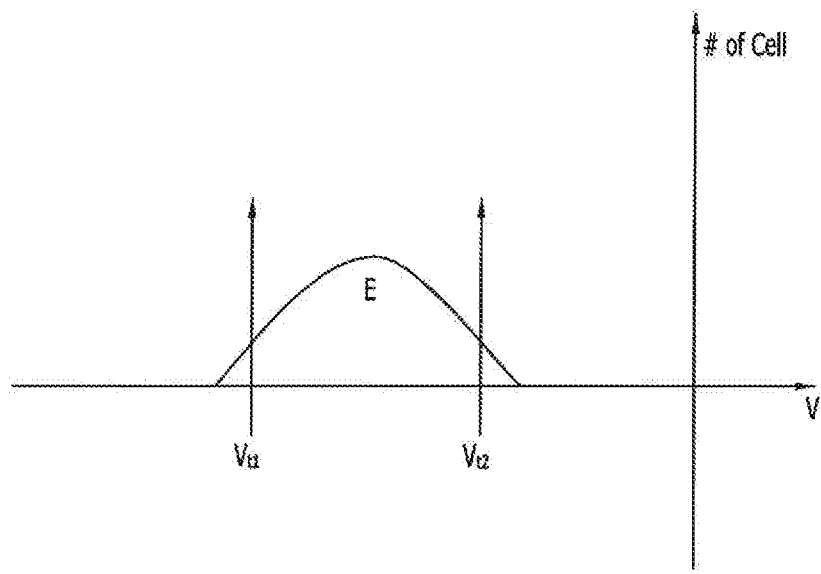
FIG. 5 is a graph illustrating a threshold voltage distribution graph showing an erase state of a memory device and test voltages.

FIG. 5 is a graph illustrating a threshold voltage distribution graph showing an erase state of a memory device and test voltages.

Referring back to FIG. 1, the controller 130 may control the memory device 150 to perform an erase operation to erase data stored in a target memory block of the memory device. The erase operation may be performed on a memory block basis, according to the characteristics of the memory device. At this time, the memory device 150 may apply an erase voltage to the word lines which are included in the target memory block. The voltage distribution graph illustrated in FIG. 5 shows an erase state based on the erase voltage applied to one word line.

The memory device 150 may perform a test operation to check whether the erase operation on the target memory block has been performed normally. For example, the controller 130 may control the memory device 150 to apply at least one test voltage to at least one of the plurality of word lines included in the target memory block, respectively, and determine the status of the corresponding memory block based on the at least test voltage. In an embodiment, the controller 130 may control the memory device 150 to apply at least one test voltage to each of the plurality of word lines included in the target memory block, respectively, and determine the status of the corresponding memory block based on the test voltages. In a specific embodiment, a first and a second test voltage may be applied to each of the word lines of the target memory block. The first and second test voltages may have the same or different values. That is, the controller 130 may perform the test operation to determine the status of the memory block.

For example, when it is assumed that the target memory block includes first to fourth word lines, the controller 130 may control the memory device 150 to apply first and second test voltages $V_{t1}$ and $V_t$ to the first word line, in order to determine a voltage distribution in the erase state E. The first and second test voltages $V_{t1}$ and $V_{t2}$ may be different. The second test voltage $V_{t2}$ may be greater than the first test voltage $V_{t1}$. The first and second test voltages $V_{t1}$ and $V_{t2}$ may be set by a designer. At this time, a memory cell sensed through the first and second test voltages $V_{t1}$ and $V_{t2}$ may be expressed as '0' when the memory cell is normal, or expressed as '1' when the memory cell contains an error.

And, the controller 130 may count the number of memory cells which have a '1' logic value sensed by the first and second test voltages $V_{t1}$ and $V_{t2}$. Hereafter, the memory cells which have the '1' logic value are referred as error memory cells. Furthermore, since the target memory block includes four word lines, the controller 130 may control the memory device 150 to apply a total of eight test voltages, i.e., two test voltages per word line. The reason for applying two test voltages per word line is that the error memory cells are relatively much sensed near the right/left tail of the threshold voltage distribution. Based on the counted number of error memory cells, the controller 130 may determine the status of the target memory block. That is, when the counted number of error memory cells is greater than a preset threshold value, the controller 130 may determine that the target memory block is a bad block.

As described above, the controller 130 may perform a test operation on each of the word lines, in order to determine the status of the corresponding memory block following each erase operation. However, when the unnecessary test operation is performed on each of the word lines after each erase operation, the entire system performance may be degraded. An embodiment of the present invention overcomes this concern by employing a method in which the controller 130 can perform a test operation selectively. For example, according to an embodiment of the present invention the controller 130 may skip performing a test operation after one or more erase operations. According to another embodiment, a selective test operation may include that the controller 130 may perform a test operation only to some of the word lines of a target memory block following one or more erase operations. According to yet another embodiment, the controller 130 may be capable for performing a selective test operation which may include skipping an entire test operation after one or more erase operations and/or skipping a test operation only to some of the word lines of a target memory block following one or more erase operations.

Figure 6:
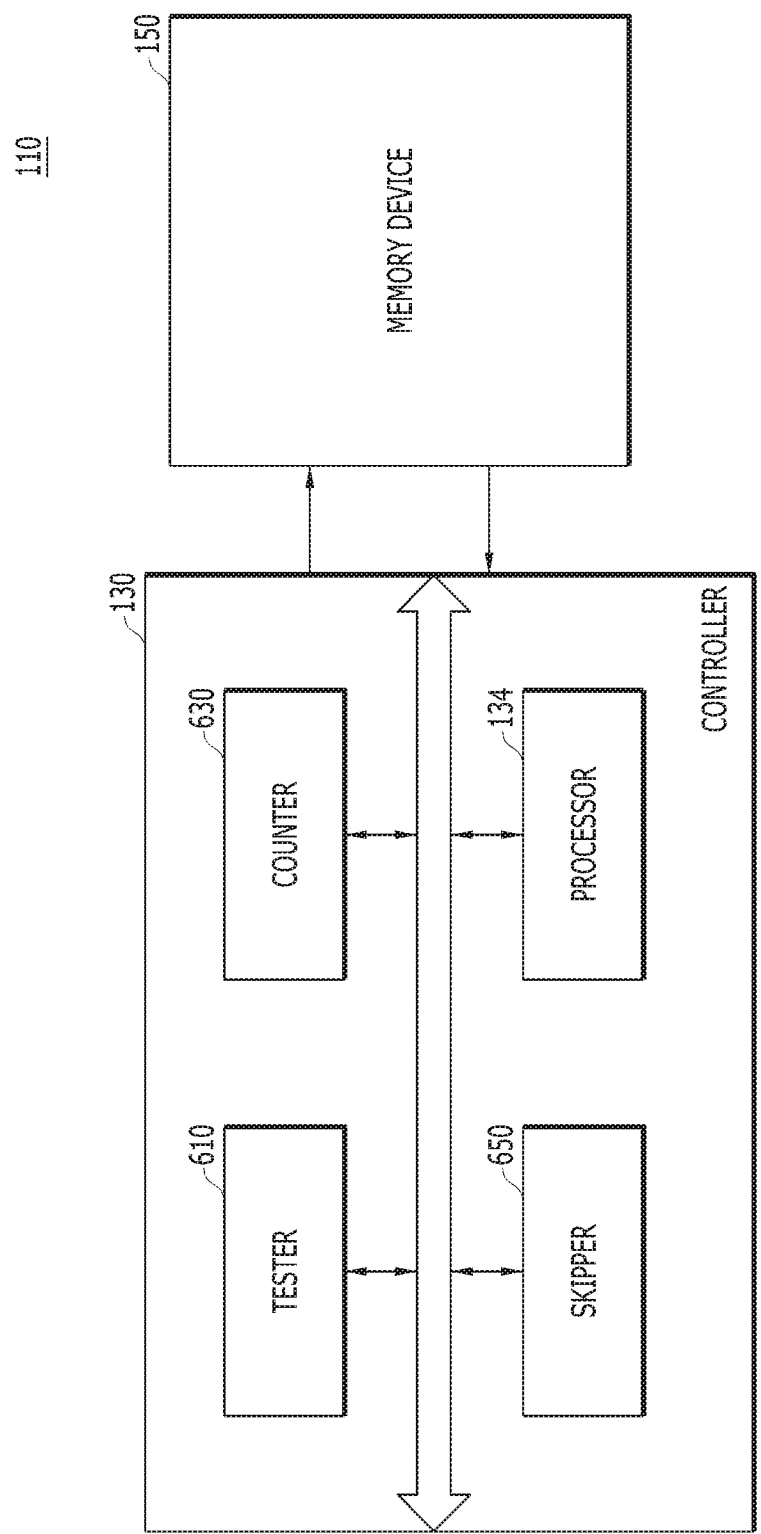
FIG. 6 is a diagram illustrating a memory system in accordance with an embodiment of the present disclosure.

FIG. 6 illustrates a memory system 110 in accordance with an embodiment. Referring to FIG. 6, the memory system 110 may include a controller 130 and a memory device 150. As described with reference to FIGS. 1 to 4, the memory device 150 may include a plurality of memory blocks. Each of the memory blocks may include a plurality of word lines. Hereafter, it is supposed for simplicity in explaining the invention that each memory block includes four word lines.

The controller 130 may include the processor 134 as described with reference to FIG. 1, and further include a tester 610, a counter 630 and a skipper 650. Hereafter, it is supposed that a plurality of erase operations are performed on the target memory block.

The processor 134 may control the memory device 150 to erase data stored in the target memory block. The erase operation may be performed on a memory block basis, however, the invention is not limited in this way. An example of a memory that is erased on a memory block basis is a NAND flash memory. Generally, however, according to the characteristics of the memory device 150 the erase operation may be performed on a different unit basis.

The tester 610 may determine the status of the target memory block on which a first erase operation has been performed, through a test operation as described, for example, with reference to FIG. 5. Specifically, the tester 610 may control the memory device 150 to apply test voltages to the plurality of word lines included in the target memory block, respectively. For example, the tester 610 may control the memory device 150 to apply two test voltages to each word line according to the test method explained in FIG. 5. The two test voltages applied to each word line of the target memory block may be the same or different. For example, the tester 610 may control the memory device 150 to apply first and second test voltages to a first word line and to apply third and fourth test voltages to a second word line. According to the same principle, the tester 610 may control the memory device 150 to apply the first to eighth test voltages to the first to fourth word lines, respectively. Therefore, the tester 610 may control the memory device 150 to apply a total of eight test voltages, in order to determine the status of the target memory block. However, this configuration is only an example, and the present embodiment is not limited thereto. Each pair of test voltages may be applied and test a memory region (also referred to as a point of the memory block that has been erased). For example, the point may be a single memory cell, or a plurality of memory cells of a single word line or all the memory cells of a single word line. Hereafter, a point where the first pair of test voltages is applied to the first word line may be defined as a first point, a point where the second pair of test voltages is second word line may be defined as a second point, a point where the third pair of test voltages is applied to the third word line may be defined as a third point, and a point where the fourth pair of test voltages is applied to the fourth word line may be defined as the fourth point.

The counter 630 may count the numbers of error memory cells (hereinafter referred to as error memory cell numbers) sensed by the test voltages applied to the respective word lines. The counter 630 may store the counted numbers of error memory cells. For example, according to the described example, a total of eight test voltages may be applied, i.e., four pairs of test voltages with each pair applied to one word line. The counter 630 may store first to eighth error memory cell numbers, each corresponding to the number of error memory cells detected in each test voltage application, i.e., corresponding to the respective points where the test voltages are applied. So, for the described example, two error memory cell numbers may be counted and stored by the counter 630 for each word line.

In another embodiment, the counter 630 may store first to eighth error memory cell numbers, each corresponding to a single word line. For example, an error memory cell number may be counted and stored by the counter 630 for each word line based on one or two test voltages applied to the word line. The tester 610 may compare each of the error memory cell numbers counted by the counter 630 to a preset error threshold value, and determine the status of the target memory block.

For example, when any one of the first to eighth error memory cell numbers is equal to or greater than the preset error threshold value, the tester 610 may register the target memory block as a bad block. The memory block registered as a bad block cannot be set to be a target of a subsequent read or program operation, as long as there are no special circumstances.

When all of the first to eighth error memory cell numbers are less than the preset error threshold value, the skipper 650 may set a test skip number to skip a test operation for a subsequent erase operation.

In various embodiments, the skipper 650 may set the test skip number to a value that is inversely proportional to the greatest error memory cell number among the first to eighth error memory cell numbers. For example, when the maximum value of the first to eighth error memory cell numbers is '8' in the case where the error threshold value is '10', the skipper 650 sets the test skip number to '2'. When the maximum value of the first to eighth error memory cell numbers is '4' in the case where the error threshold value is '10', the skipper 650 may sets the test skip number to '10'. In other words, the skipper 650 may set a greater test skip number for a lower maximum value of the first to eighth error memory cell numbers than for a higher maximum value of the first to eighth error memory cell numbers. That is because, the lower the maximum value of the first to eighth error memory cell numbers is, the less likely is that the target memory block will be determined to be a bad block in a subsequent test operation following the next erase operation, hence, based on the higher test skip number the controller may skip the next test operation. The value of the test skip number when compared to a preset value may be used to determine whether the next operation can be skipped altogether. It is further noted that the above values are only provided as examples for convenience of description, and the present embodiment is not limited thereto.

The skipper 650 may decide whether to skip the entire test operation or skip a part of the test operation. That is, the skipper 650 may decide to skip one or more test points or an entire test operation following the next erase operation. For example, in an embodiment, when the maximum value of the first to eighth error memory cell numbers is less than the preset error threshold value, the skipper 650 may set the test skip information to skip the entire test operation after the next erase operation.

On the other hand, when the maximum value of the first to eighth error memory cell numbers is less than the preset error threshold value, but the first to eighth error memory cell numbers include a point having an error memory cell number greater than or equal to a preset candidate threshold value, the skipper 650 may identify this point as a candidate point and may set test skip information to perform a test operation only on the candidate point and to skip test operations for the other normal points. For example, the same test skip number may be set to the test operations for the normal points. Moreover, it is noted that the test skip number may be set to direct the skipping of one or more test operations for the normal points. Furthermore, until the skipped numbers of test operations for the normal points reach the set test skip number, the test operation for the candidate point may be performed whenever the erase operation is performed.

That is, the tester 610 may skip a test operation for a second erase operation following the first erase operation, based on the test skip point set by the skipper 650. The first erase operation may indicate an erase operation performed before the test skip information is set, and the second erase operation may indicate an erase operation performed after the test skip information is set. The test skip information may be reset after the skipped number of test operations reaches the preset test skip number.

For example, it is supposed that first to eight points were tested following a first erase operation, that the fourth and sixth points are determined to be candidate points, and that the remaining points i.e., the first to third points, the fifth point, and the seventh and eighth points are normal points. Moreover, it is supposed that the test skip number for the test operations of the normal points is set to 3. Accordingly, the tester 610 may perform test operations only on the fourth to sixth points, in order to determine the status of the target memory block after the next erase operation (i.e., a second erase operation) has been performed on the target memory block. Furthermore, the tester 610 may perform test operations on the first to eighth points after the fifth erase operation for the target memory block is performed, i.e., after skipping the test operations are skipped for the next three erase operations.

For another example, when the skipper 650 sets the test skip number for the target memory block to 3 and sets the test skip information to skip the entire test operations, the tester 610 may not perform a test operation for determining the status of the target memory block following the next three erase operations performed on the target memory block are ended. Hence, assuming that the test skip information is set following a first erase operation, after the fifth erase operation for the target memory block is performed, the tester 610 may perform the test operation to determine the status of the target memory block.

Figure 7:
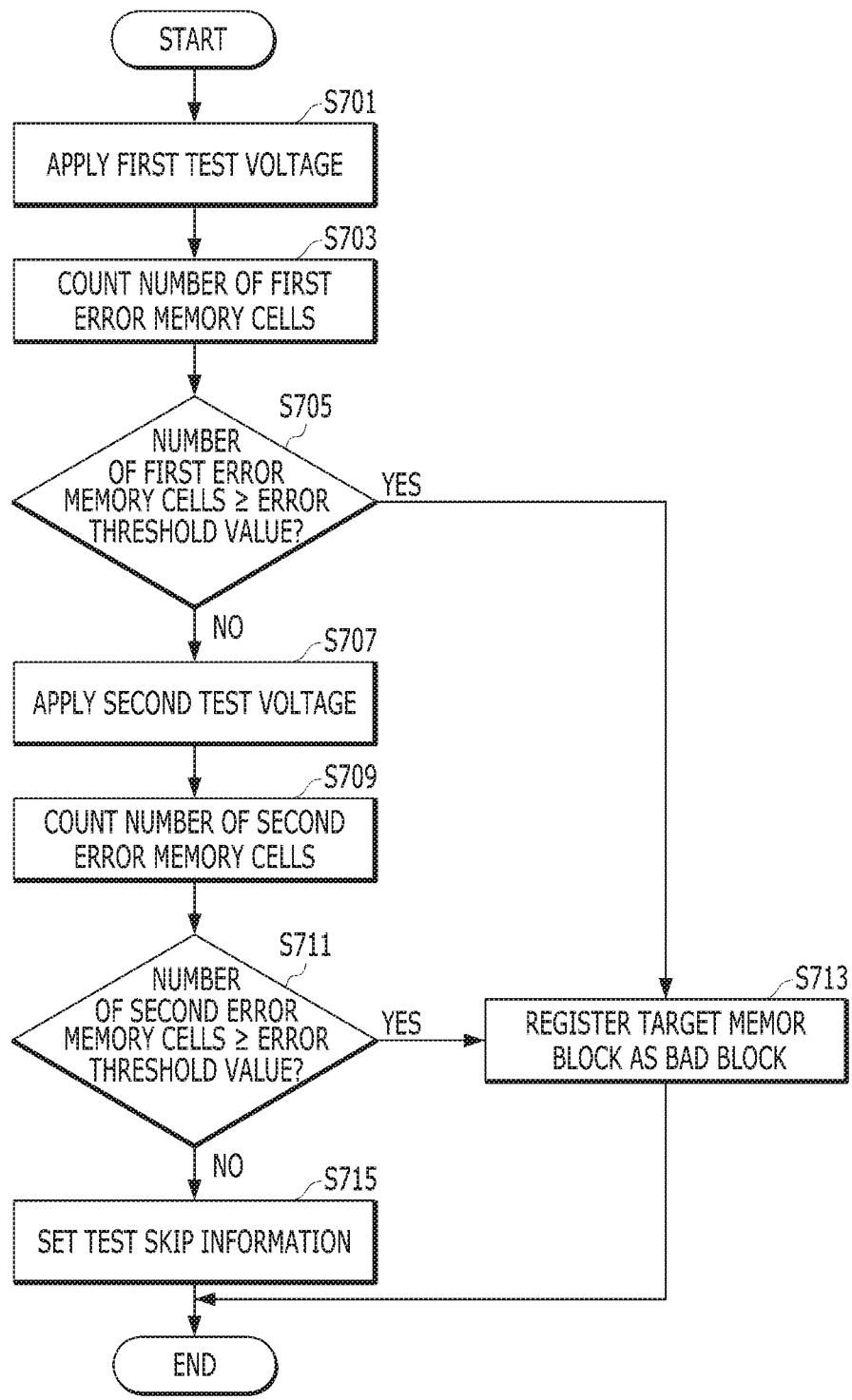
FIG. 7 is a flowchart illustrating an operation of a controller in accordance with an embodiment of the present disclosure.

FIG. 7 is a flowchart illustrating an operation of a controller, for example, the operation of the controller 130 of FIG. 6, in accordance with the present embodiment. Specifically, FIG. 7 illustrates a process of determining the status of the target memory block after an erase operation. Hereafter, it is supposed that the target memory block includes one word line, for convenience of description.

At step S701, the tester 610 may control the memory device 150 to apply a first test voltage to a word line.

At step S703, the counter 630 may count the number of first error memory cells sensed by the first test voltage.

At step S705, the tester 610 may compare the counted number of first error memory cells to a preset error threshold value.

When the number of first error memory cells is greater than or equal to the preset error threshold value (YES at step S705), the tester 610 may register the target memory block as a bad block at step S713.

When the number of first error memory cells is less than the preset error threshold value (NO at step S705), the tester 610 may control the memory device 150 to apply a second test voltage, in order to continuously perform the test operation, at step S707.

At step S709, the counter 630 may count the number of second error memory cells sensed by the second test voltage.

At step S711, the tester 610 may compare the counted number of second error memory cells to the preset error threshold value.

When the number of second error memory cells is greater than or equal to the preset error threshold value (YES at step S711), the tester 610 may register the target memory block as a bad block at step S713.

When the number of second error memory cells is less than the preset error threshold value (NO at step S711), the skipper 650 may set the test skip information for the target memory block, based on the first and second error memory cell numbers, at step S715. For example, as described earlier, the test skip information for the target memory block may be or include a test skip number. Although not illustrated, the tester 610 may compare the first and second error memory cell numbers to the error threshold value, and the skipper 650 may set a test skip point based on the comparison result.

Figure 8:
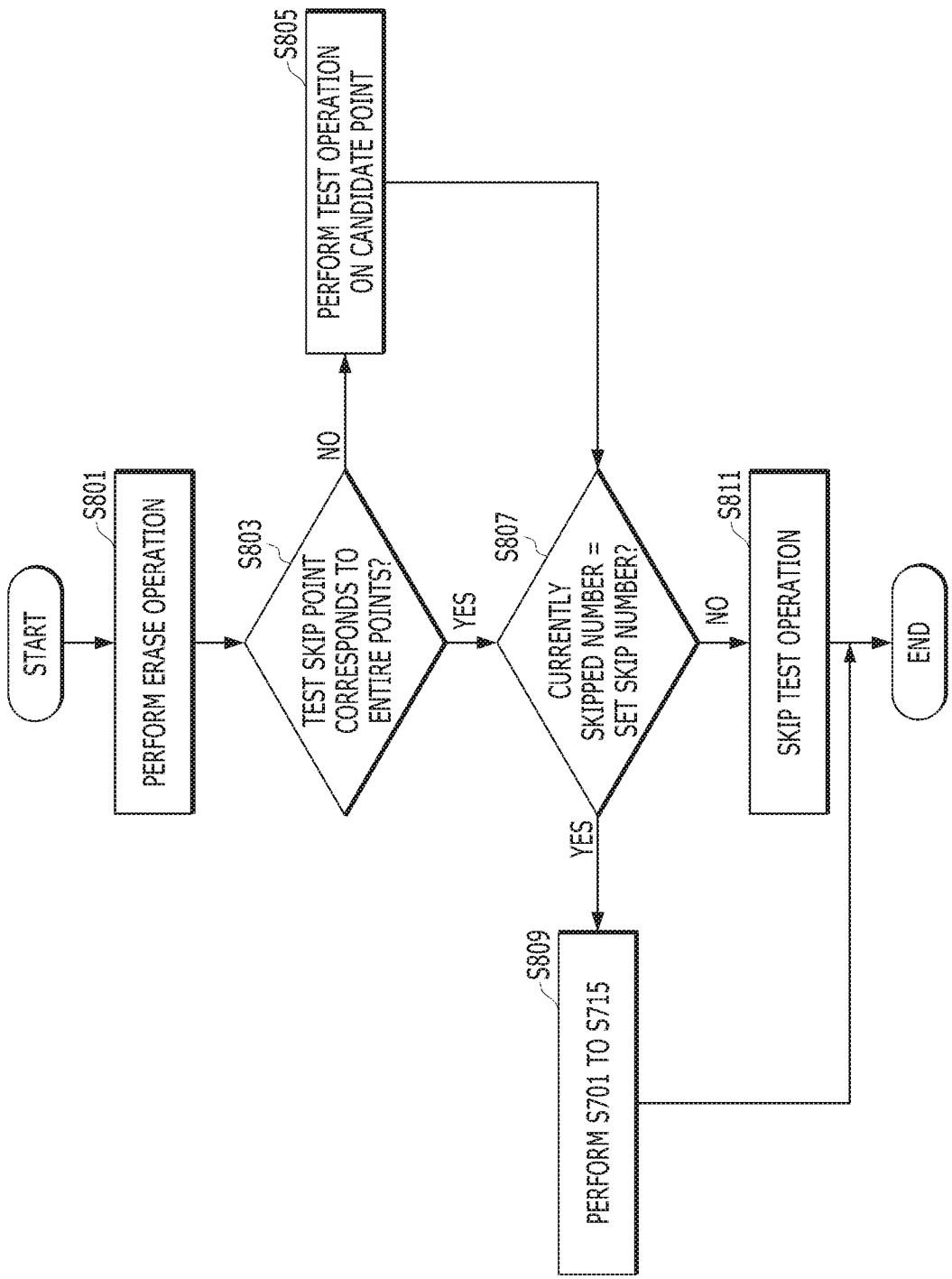
FIG. 8 is a flowchart illustrating an operation of a controller in accordance with an embodiment of the present disclosure.

FIG. 8 is a flowchart illustrating an operation of a controller, for example, the operation of the controller 130 of FIG. 6, in accordance with the present embodiment. FIG. 8 illustrates a test operation for the second erase operation which is performed after the test skip information has been set.

At step S801, the processor 134 may control the memory device 150 to perform an erase operation on the target memory block.

At step S803, the tester 610 may check the set test skip information.

When the set test skip point does not correspond to any one of the entire points (NO at step S803), the tester 610 may perform a test operation on a candidate point at step S805.

When the set test skip point corresponds to the entire points (YES at step S803), the tester 610 may check the currently skipped number and the set skip number for the normal points instead of the candidate point, at step S807.

When the skipped number is equal to the set skip number (YES at step S807), the controller 130 may perform operations corresponding to steps S701 to S715 of FIG. 7 at step S809.

When the skipped number is not equal to the preset skip number (NO at step S807), the tester 710 may skip the test operation at step S811.

As described above, since the controller 130 omitting the test operation for a specific point, the controller 130 may shorten the test time required for the erase operation. As a result, the controller 130 may perform the erase operation more efficiently than in the related art.

Hereinafter, a data processing system and electronic devices which may be constituted with the memory system 110 including the memory device 150 and the controller 130, which are described above by referring to FIGS. 1 to 8, will be described in detail with reference to FIGS. 9 to 17.

FIGS. 9 to 17 are diagrams schematically illustrating application examples of the data processing system of FIGS. 1 to 8 according to various embodiments.

Figure 9:
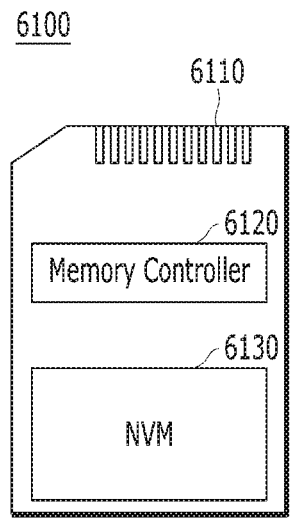
FIGS. 9 to 17 are diagrams schematically illustrating application examples of a data processing system, in accordance with various embodiments of the present invention.

FIG. 9 is a diagram schematically illustrating an example of the data processing system including the memory system in accordance with an embodiment. FIG. 9 schematically illustrates a memory card system 6100 including the memory system in accordance with an embodiment.

Referring to FIG. 9, the memory card system 6100 may include a memory controller 6120, a memory device 6130 and a connector 6110.

More specifically, the memory controller 6120 may be connected to the memory device 6130, and may be configured to access the memory device 6130. The memory device 6130 may be embodied by a nonvolatile memory (NVM). By the way of example but not limitation, the memory controller 6120 may be configured to control read, write, erase and background operations onto the memory device 6130. The memory controller 6120 may be configured to provide an interface between the memory device 6130 and a host (not shown) and/or a drive firmware for controlling the memory device 6130. That is, the memory controller 6120 may correspond to the controller 130 in the memory system 110 described with reference to FIGS. 1 to 8, while the memory device 6130 may correspond to the memory device 150 described with reference to FIGS. 1 to 8.

Thus, as shown in FIG. 1, the memory controller 6120 may include a random access memory (RAM), a processing unit, a host interface, a memory interface and an error correction unit. The memory controller 130 may further include the elements described in FIG. 1.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system in accordance with an embodiment may be applied to wired and/or wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), a secured digital (SD) card (e.g., SD, miniSD, microSD and SDHC) and a universal flash storage (UFS).

Figure 10:
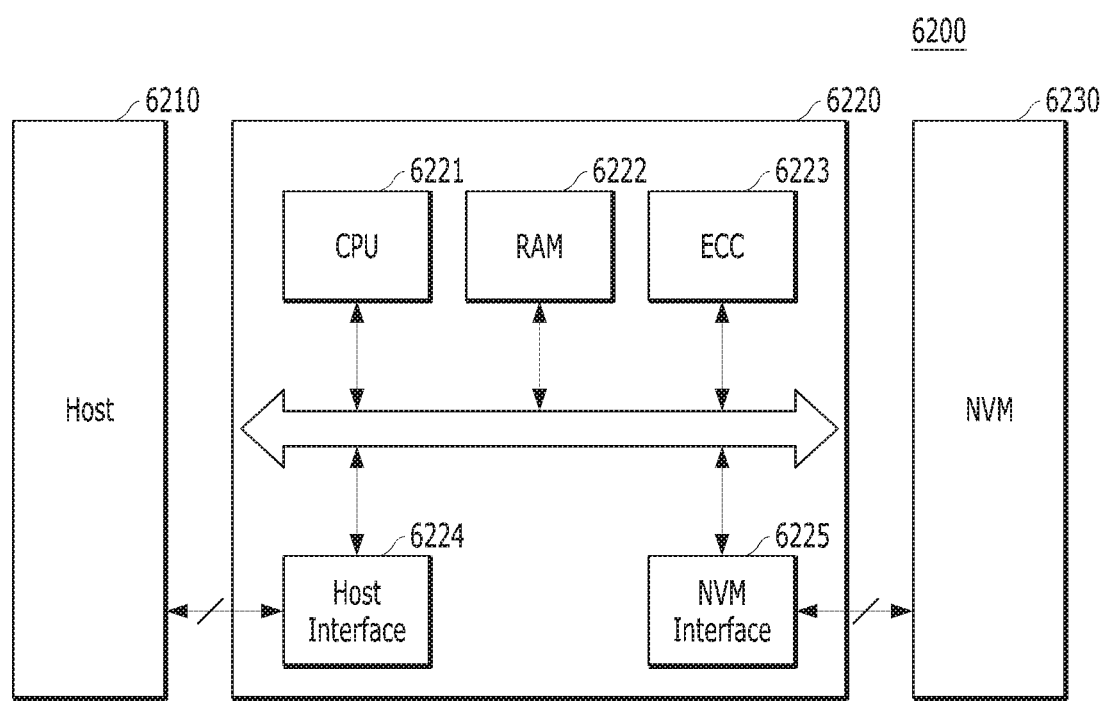

FIG. 10 is a diagram schematically illustrating another example of a data processing system 6200 including a memory system, in accordance with an embodiment.

Referring to FIG. 10, the data processing system 6200 may include a memory device 6230 having one or more nonvolatile memories (NVMs) and a memory controller 6220 for controlling the memory device 6230. The data processing system 6200 may serve as a storage medium such as a memory card (CF, SD, micro-SD or the like) or USB device, as described with reference to FIG. 1. The memory device 6230 may correspond to the memory device 150 in the memory system 110 described in FIGS. 1 to 8, and the memory controller 6220 may correspond to the controller 130 in the memory system 110 described in FIGS. 1 to 8.

The memory controller 6220 may control a read, write, or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC unit 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. in this case, the ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may transmit to, and/or receive from, the host 6210 data or signals through the host interface 6224, and may transmit to, and/or receive from, the memory device 6230 data or signals through the NVM interface 6225. The host interface 6224 may be connected to the host 6210 through a parallel advanced technology attachment (PATA) bus, a serial advanced technology attachment (SATA) bus, a small computer system interface (SCSI), a universal serial bus (USB), a peripheral component interconnect-express (PCIe), or a NAND interface. The memory controller 6220 may have a wireless communication function with a mobile communication protocol such as wireless fidelity (WiFi) or Long Term Evolution (LTE). The memory controller 6220 may be connected to an external device, e.g., the host 6210, or another external device, and then transmit and/or receive data to and/or from the external device. As the memory controller 6220 is configured to communicate with the external device through one or more of various communication protocols, the memory system and the data processing system in accordance with an embodiment may be applied to wired and/or wireless electronic devices or particularly a mobile electronic device.

Figure 11:
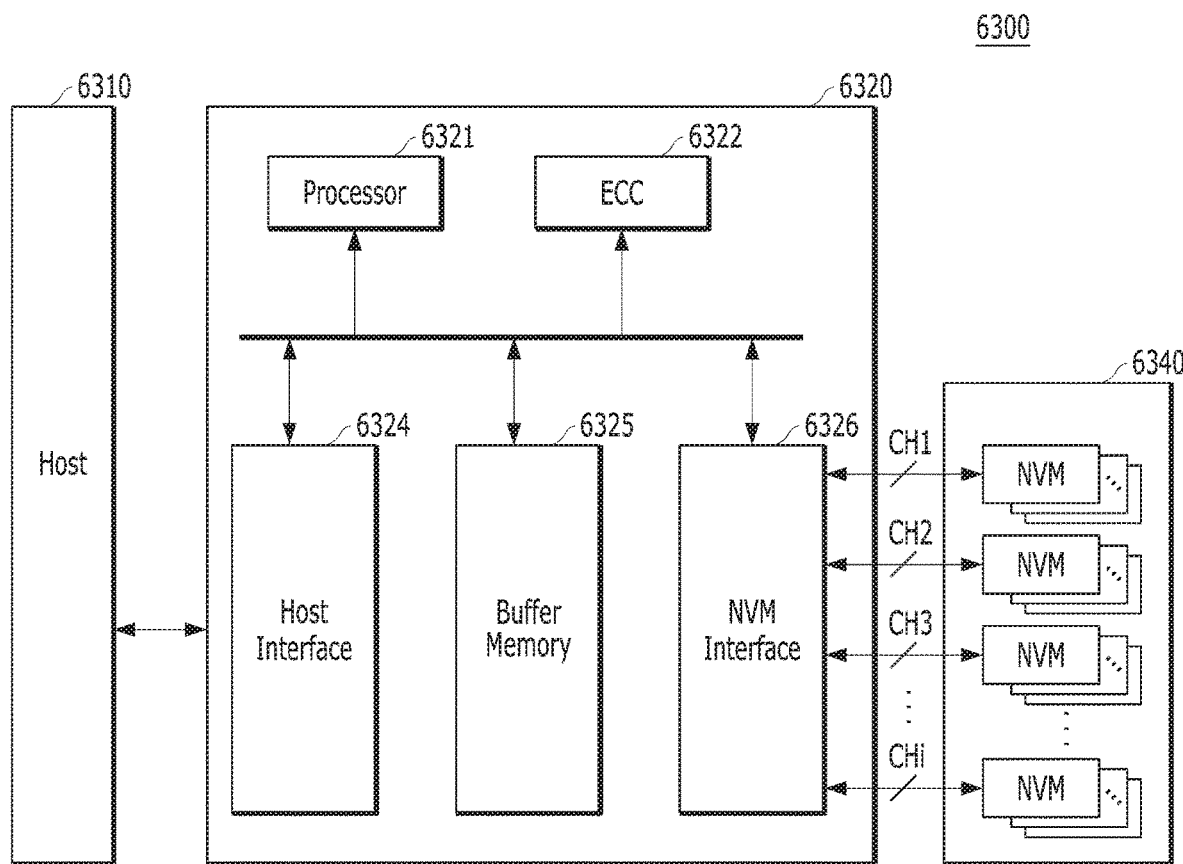

FIG. 11 is a diagram schematically illustrating another example of the data processing system including the memory system in accordance with an embodiment. FIG. 11 schematically illustrates a solid state drive (SSD) to which the memory system in accordance with an embodiment is applied.

Referring to FIG. 11, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). For the purpose of description, FIG. 11 illustrates that the buffer memory 6325 exists in the controller 6320, but the buffer memory 6325 may be located or arranged outside the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, i.e., RAID level information of the write command provided from the host 6310 in the SSDs 6300, and may output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 12:
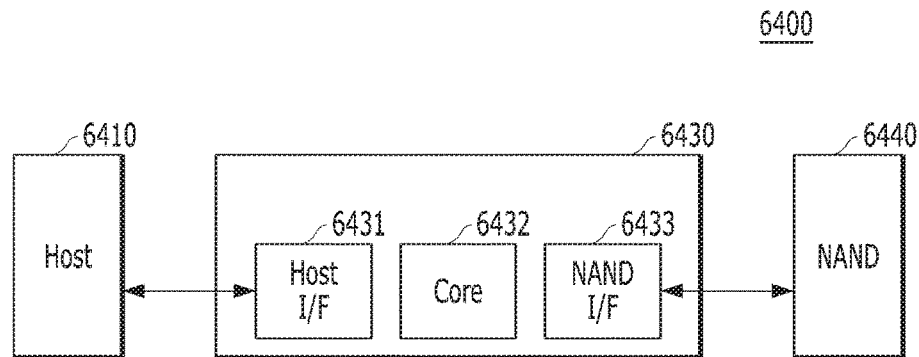

FIG. 12 is a diagram schematically illustrating another example of the data processing system including the memory system in accordance with an embodiment. FIG. 12 schematically illustrates an embedded Multi-Media Card (eMMC) 6400 to which the memory system in accordance with an embodiment is applied.

Referring to FIG. 12, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control the operations of the eMMC 6400, the host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

FIGS. 12 to 15 are diagrams schematically illustrating other examples of the data processing system including the memory system in accordance with an embodiment. FIGS. 12 to 15 schematically illustrate universal flash storage (UFS) systems to which the memory system in accordance with an embodiment is applied.

Referring to FIGS. 12 to 15, the UFS systems 6500, 6600, 6700 and 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired and/or wireless electronic devices or particularly mobile electronic devices, the UFS devices 6520, 6620, 6720, 6820 may serve as embedded UFS devices. The UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700 and 6800 may communicate with external devices, e.g., wired and/or wireless electronic devices or particularly mobile electronic devices through UFS protocols. The UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 10 to 12, and the UFS cards 6530, 6630, 6730, 6830 may be embodied in the form of the memory card system 6100 described with reference to FIG. 9.

Furthermore, in the UFS systems 6500, 6600, 6700 and 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, e.g., universal storage bus (USB) Flash Drives (UFDs), multi-media card (MMC), secure digital (SD), mini-SD, and micro-SD.

Figure 13:
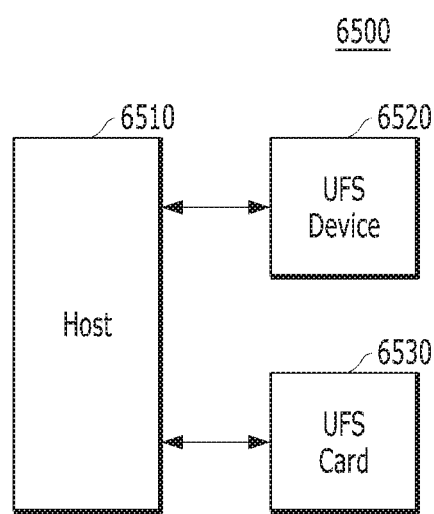

In the UFS system 6500 illustrated in FIG. 13, each of the host 6510, the UFS device 6520 and the UFS card 6530 may include UniPro. The host 6510 may perform a switching operation to communicate with at least one of the UFS device 6520 and the UFS card 6530. The host 6510 may communicate with the UFS device 6520 or the UFS card 6530 through link layer switching, e.g., L3 switching at the UniPro. In this case, the UFS device 6520 and the UFS card 6530 may communicate with each other through a link layer switching at the UniPro of the host 6510. In an example, the configuration in which one UFS device 6520 and one UFS card 6530 are connected to the host 6510 has been exemplified for convenience of description. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520. Herein, the form of a star means an arrangement that a single device is coupled with plural other devices or cards for centralized control.

Figure 14:
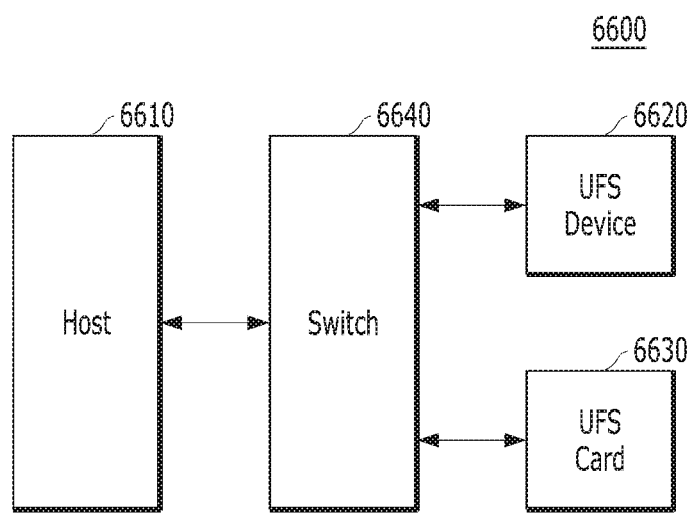

In the UFS system 6600 illustrated in FIG. 14, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an example, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 15:
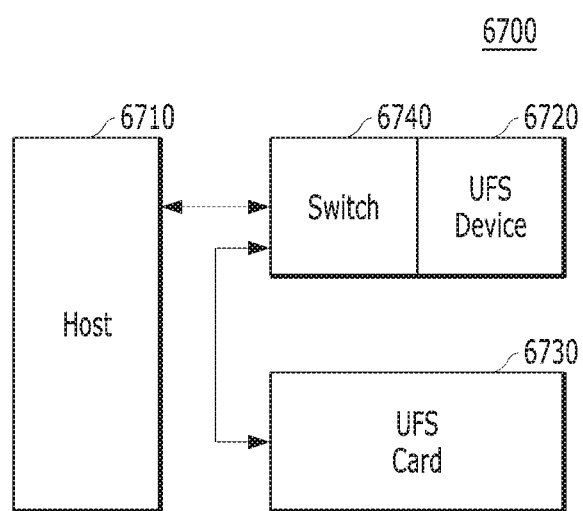

In the UFS system 6700 illustrated in FIG. 15, each of the host 6710, the UFS device 6720 and the UFS card 6730 may include UniPro. The host 6710 may communicate with the UFS device 6720 or the UFS card 6730 through a switching module 6740 performing a switching operation, for example, the switching module 6740 which performs link layer switching at the UniPro, for example, L3 switching. In this case, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an example, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 16:
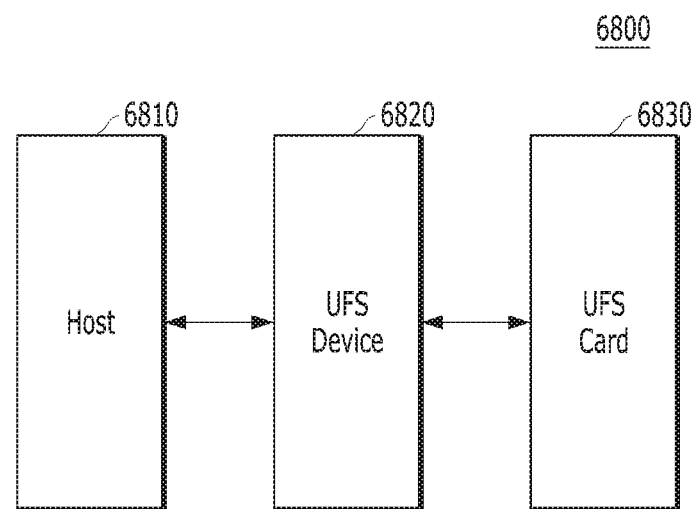

In the UFS system 6800 illustrated in FIG. 16, each of the host 6810, the UFS device 6820 and the UFS card 6830 may include M-PHY and UniPro. The UFS device 6820 may perform a switching operation to communicate with the host 6810 and the UFS card 6830. The UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. Here, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 17:
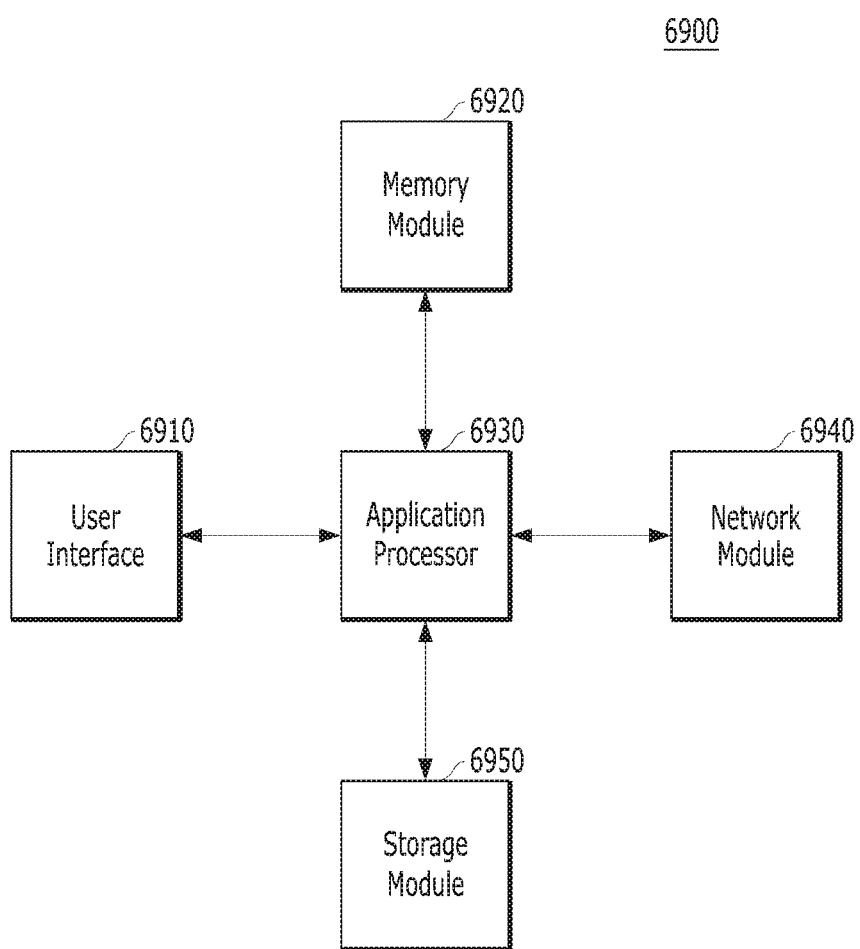

FIG. 17 is a diagram schematically illustrating another example of the data processing system including the memory system in accordance with an embodiment. FIG. 17 is a diagram schematically illustrating a user system 6900 to which the memory system in accordance with an embodiment is applied.

Referring to FIG. 17, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 11 to 16.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired and/or wireless communication with an external device. The user interface 6910 may display data processed by the processor 6930 on a display and touch module of the mobile electronic device, or support a function of receiving data from the touch panel.

While the present invention has been described with respect to specific embodiments, it will be apparent to those skilled in the art that various changes and modifications may be made without departing from the spirit and scope of the invention as determined in the following claims.

What is claimed is:

1. A controller comprising:
    a processor suitable for performing a first erase operation on a target memory block;
    a tester suitable for performing a test operation to apply test voltages to selected points of word lines included in the target memory block;
    a counter suitable for counting the numbers of error memory cells sensed through the test voltages at the selected points; and
    a skipper suitable for setting test skip information based on the numbers of error memory cells,
    wherein the tester performs the test operation according to the test skip information when a second erase operation is performed on the target memory block,
    wherein the first erase operation comprises an erase operation performed before the test skip information is set, and the second erase operation comprises an erase operation performed after the test skip information is set.

2. The controller of claim 1, wherein the test skip information comprises a test skip number and a test skip point.

3. The controller of claim 2, wherein when the maximum value of the error memory cell numbers is smaller than an error threshold value, the skipper sets the test skip number based on the maximum value.

4. The controller of claim 3, wherein when the maximum value of the error memory cell numbers is smaller than the error threshold value, the skipper sets the test skip point to skip the entire test operation.

5. The controller of claim 4, wherein when the repeated number of second erase operations reaches the test skip number, the tester performs the test operation on the target memory block again.

6. The controller of claim 3, wherein when the maximum value of the error memory cell numbers is smaller than the error threshold value, but there is a selected point of which the error memory cell number is greater than or equal to a candidate threshold value, the skipper sets the test skip information to partially skip the test operation.

7. The controller of claim 6, wherein the tester partially performs the test operation on the target memory block based on the test skip information, when the repeated number of second erase operations has not reached the test skip number, and performs the entire test operation on the target memory block again, when the repeated number of second erase operations has reached the test skip number.

8. The controller of claim 1, wherein when any one of the error memory cell numbers is greater than or equal to the error threshold value, the tester registers the target memory block as a bad block.

9. An operating method of a controller, comprising:
performing a first erase operation on a target memory block;
performing a test operation to apply test voltages to selected points of word lines included in the target memory block;
counting the numbers of error memory cells sensed through the test voltages at the selected points; and
setting test skip information based on the numbers of error memory cells; and
performing the test operation according to the test skip information when a second erase operation is performed on the target memory block,
wherein the first erase operation comprises an erase operation performed before the test skip information is set, and the second erase operation comprises an erase operation performed after the test skip information is set.

10. The operating method of claim 9, wherein the test skip information comprises a test skip number and a test skip point.

11. The operating method of claim 10, wherein the setting of the test skip information comprises setting the test skip number based on the maximum value of the error memory cell numbers, when the maximum value is smaller than an error threshold value.

12. The operating method of claim 11, wherein the setting of the test skip information comprises setting the test skip point to skip the entire test operation, when the maximum value of the error memory cell numbers is smaller than the error threshold value.

13. The operating method of claim 12, wherein the performing of the test operation according to the test skip information comprises performing the test operation on the target memory block again, when the repeated number of second erase operations has reached the test skip number.

14. The operating method of claim 11, wherein the setting of the test skip information comprises setting the test skip information to partially skip the test operation, when the maximum value of the error memory cell numbers is smaller than the error threshold value, but there is a selected point of which the error memory cell number is greater than or equal to a candidate threshold value.

15. The operating method of claim 14, wherein the performing of the test operation according to the test skip information comprises partially performing the test operation on the target memory block based on the test skip information, when the repeated number of second erase operations has not reached the test skip number, and performing the entire test operation on the target memory block again, when the repeated number of second erase operations has reached the test skip number.

16. The operating method of claim 9, further comprising registering the target memory block as a bad block, when any one of the error memory cell numbers is greater than or equal to the error threshold value.

17. A memory system comprising:
a memory device comprising a target memory block; and
a controller suitable for controlling the memory device,
wherein the controller comprises:
a processor suitable for performing a first erase operation on the target memory block;
a tester suitable for performing a test operation to apply test voltages to selected points of word lines included in the target memory block;
a counter suitable for counting the numbers of error memory cells sensed through the test voltages at the selected points; and
a skipper suitable for setting test skip information based on the numbers of error memory cells,
wherein the tester performs the test operation according to the test skip information when a second erase operation is performed on the target memory block,
wherein the first erase operation comprises an erase operation performed before the test skip information is set, and the second erase operation comprises an erase operation performed after the test skip information is set.

18. The memory system of claim 17, wherein the test skip information comprises a test skip number and a test skip point.

19. The memory system of claim 18, wherein when the maximum value of the error memory cell numbers is smaller than an error threshold value, the skipper sets the test skip number based on the maximum value.

20. The memory system of claim 17, wherein when the maximum value of the error memory cell numbers is smaller than the error threshold value, the skipper set the test skip point to skip the entire test operation.

* * * * *